(12) United States Patent
Hayashi et al.

(10) Patent No.: US 6,696,714 B2
(45) Date of Patent: Feb. 24, 2004

(54) MULTICHIP SEMICONDUCTOR DEVICE HAVING A HIP WITH REDUNDANCY RESTORATION FUSE THAT AFFECTS A REDUNDANT MEMORY ARRAY

(75) Inventors: Kohtaro Hayashi, Takatsuki (JP); Masanori Shirahama, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/194,593

(22) Filed: Jul. 11, 2002

(65) Prior Publication Data

US 2003/0015733 A1 Jan. 23, 2003

(30) Foreign Application Priority Data

Jul. 23, 2001 (JP) ........................................ 2001-221904

(51) Int. Cl.[7] ............................................. H01L 27/108
(52) U.S. Cl. ....................................... 257/296; 257/723
(58) Field of Search ................................. 257/296–330

(56) References Cited

U.S. PATENT DOCUMENTS

| | | | |
|---|---|---|---|
| 5,889,712 A | * | 3/1999 | Sugibayashi |
| 6,201,733 B1 | | 3/2001 | Hiraki et al. |
| 6,426,902 B1 | * | 7/2002 | Lee et al. |
| 6,529,438 B1 | * | 3/2003 | Suzuki et al. |

* cited by examiner

*Primary Examiner*—Fetsum Abraham
(74) *Attorney, Agent, or Firm*—Merchant & Gould P.C.

(57) ABSTRACT

A multichip semiconductor device with an improved yield and a reduced inspection cost is provided in which a fuse is provided on a first semiconductor chip while a fuse is not provided on a second semiconductor chip as a rewritable memory, and these chips are connected inside a package. The second semiconductor chip includes redundancy cells to be replaced for defective bits. To produce a post-redundancy-restoration state in which the defective bits are replaced with the redundancy cells before the second semiconductor chip is connected with the first semiconductor chip, the second semiconductor chip includes a restoration state determining circuit and a command decode circuit. The restoration state determining circuit is for storing a redundancy restoration solution for restoring defective bits supplied via a first external input pad. The command decoder circuit controls input from the first external input pad to the restoration state determining circuit according to a signal supplied via a second external input pad.

11 Claims, 11 Drawing Sheets

MULTICHIP SEMICONDUCTOR DEVICE HAVING A HIP WITH REDUNDANCY RESTORATION FUSE THAT AFFECTS A REDUNDANT MEMORY ARRAY

BACKGROUND OF THE INVENTION

1. Field of the Invention

The present invention relates generally to a multichip semiconductor device that is configured so that a semiconductor chip having a function as a CPU or the like and a semiconductor chip as a rewritable memory are connected with each other inside a package.

2. Related Background Art

FIG. 14 is a view schematically illustrating an example of a structure of a conventional multichip semiconductor device. In FIG. 14, the semiconductor device has a chip-on-chip (COC) structure. It should be noted that FIG. 14 illustrates the chips in a side-by-side orientation for convenience in illustration. In the semiconductor device, a first semiconductor chip 1 having a function as a CPU or the like and a second semiconductor chip 2 as a rewritable memory are interconnected via internal connection pads PD1 and PD2 that are provided on the first and second semiconductor chips 1 and 2, respectively, and external connection pads PD 11 of the first semiconductor chip 1 are connected with external connection terminals PD via bonding wires. These chips are sealed in an integrated circuit package 3.

The second semiconductor chip 2 is equipped with a fuse 11 for storing a redundancy restoration solution for restoring defective bits having occurred therein, so as to replace defective bits with cells for redundancy restoration. Semiconductor chips for the two semiconductor chips 1 and 2 are tested independently, and only those that have passed the tests, respectively, are employed to be interconnected. As to the second semiconductor chip 2 as a rewritable memory in particular, semiconductor chips are subjected to a probe test on wafers before the redundancy restoration (hereinafter referred to as P1 test), and then, the fuses 11 of those determined as needing the redundancy restoration are blown. Thereafter, they are subjected to a probe test after the redundancy restoration (hereinafter referred to as P2 test), and the chips that have passed the foregoing test are employed to be interconnected.

In the foregoing COC structure in which pads are provided on surfaces of two semiconductor chips and the two semiconductors are interconnected and connected via the pads, as the number of input/output signals transmitted between the two chips increases, areas of the pads provided on the chips increase relative to the areas of the chips. As a result, there is a possibility that the chip area could be determined according to the pad area.

Furthermore, in the case of a memory chip such as a DRAM, its process cost itself is high, and hence, it is necessary to reduce its size so as to reduce the cost. Therefore, it could be thought of to provide the fuse 11, not on the second semiconductor chip 2 as the rewritable memory as usual, but on the first semiconductor chip 1 having a larger area. However, in this case, the second semiconductor chip 2 alone is not capable of achieving a state after the fuse 11 is blown, and therefore, the P2 test unavoidably is carried out with respect to the second semiconductor chip 2 after the interconnection. As a result, in the case where the second semiconductor chip 2 is found to be defective by the test after the interconnection, a problem arises in that the entire assembly of chips interconnected is wasted as defective.

SUMMARY OF THE INVENTION

Therefore, with the foregoing in mind, it is an object of the present invention to provide a multichip semiconductor device with an improved yield and a reduced test cost, by producing a post-redundancy-restoration state of a rewritable memory without providing a fuse on the rewritable memory, so that the P2 test is carried out before interconnecting the chips.

To achieve the foregoing object, a semiconductor device according to the present invention is a multichip semiconductor device that includes a first semiconductor chip and a second semiconductor chip as a rewritable memory that are connected with each other inside a package. In the semiconductor device, the first semiconductor chip has a fuse for redundancy restoration for storing a redundancy restoration solution for restoring defective bits in the second semiconductor chip. Further, the second semiconductor chip includes redundancy cells to be replaced for the defective bits, and has a function of producing a post-redundancy-restoration state in which the defective bits are replaced with the redundancy cells, before being connected with the first semiconductor chip.

With the foregoing configuration, it is possible to allow the second semiconductor chip as a rewritable memory without having a fuse to exhibit a state after the fuse is blown, thereby allowing the execution of the P2 test immediately after the P1 test with respect to the second semiconductor chip. This makes it unnecessary to check whether the redundancy restoration is achieved normally in the second semiconductor chip after the first semiconductor chip and the second semiconductor chip are interconnected with each other. This results in the improvement of the yield of the overall interconnected chips, thereby reducing the inspection cost.

In the semiconductor device according to the present invention, the second semiconductor chip preferably includes a first external input terminal (redundancy restoration solution input pad: PD2D), and a restoration state determining circuit for storing a redundancy restoration solution for restoring the defective bits supplied thereto via the first external input terminal.

In the foregoing configuration, once a redundancy restoration solution is supplied from outside and the restoration state determining circuit stores the redundancy restoration solution, it is possible to produce a post-redundancy-restoration state without continuously supplying the redundancy restoration solution.

Furthermore, in the semiconductor device according to the present invention, the second semiconductor chip preferably includes a second external input terminal (command signal input pad: PD2B), and a control circuit (command decoder circuit) that controls input to the restoration state determining circuit via the first external input terminal according to a signal (command signal) supplied via the second external input terminal.

This configuration allows for the reduction of the number of input terminals necessary for controlling the input of the redundancy restoration solution, as well as allows the post-redundancy-restoration state to be produced after the redundancy restoration state is confirmed completely.

Furthermore, the second semiconductor chip preferably includes a third external input terminal (redundancy restoration execution pad: PD2E) and a memory cell selecting circuit, and the restoration state determining circuit of the second semiconductor chip preferably includes an output circuit that sends the stored redundancy restoration solution to the memory cell selecting circuit according to an input signal (signal RST) supplied via the third external input terminal.

This configuration allows the second semiconductor chip to produce a pre-redundancy-restoration state and the post-redundancy-restoration state by control according to the input signal supplied via the third external input terminal, thereby making it possible to readily find out defects in circuit operations caused by the redundancy restoration.

Furthermore, the restoration state determining circuit of the second semiconductor chip preferably includes a first shift register, and stores serial data supplied via the first external input terminal (redundancy restoration solution input pad: PD2D) in synchronization with an output signal of the control circuit (command decoder circuit).

The foregoing configuration allows the number of input terminals for supplying the redundancy restoration solution to be reduced significantly.

Furthermore, the restoration state determining circuit of the second semiconductor chip preferably includes a plurality of register circuits, and varies a value held by the plurality of register circuits according to an output signal of the control circuit (command decoder circuit), in response to an input signal supplied via the second external input terminal (command signal input pad: PD2B).

This configuration makes it possible to readily test spare cells provided for the redundancy restoration, and in the test, makes it possible to produce a state completely identical to the actual restoration state.

In the semiconductor device according to the present invention, the second semiconductor chip includes: an internal voltage generating circuit including a detection level varying circuit for varying an internal generated voltage; a fourth external input terminal (detection level varying signal input pad: PD2F); and a detection level determining circuit that determines whether the detection level varying circuit is activated, in synchronization with an output signal of the control circuit (command decoder circuit), according to an input signal supplied via the fourth external input terminal.

This configuration makes it possible to vary the detection level of the internal voltage generating circuit, thereby changing an operation of the second semiconductor chip, without changing a physical state, such as blowing a fuse, changing a wiring layer by changing a mask, etc.

In this case, the detection level determining circuit preferably includes second register circuits corresponding to respective generated voltages that can be generated when the internal voltage generating circuit utilizes the detection level varying circuit, and a route changing circuit that changes routes of input signals and output signals to/from the second register circuits according to an input signal supplied via the fourth external input terminal (detection level varying signal input pad: PD2F).

This configuration makes it possible to vary the detection level according to an input signal corresponding to a shift from an original detection level, thereby enabling a test and a variation in the state following the state before the variation.

In the semiconductor device according to the present invention, the second semiconductor chip preferably includes: an internal timing signal generating circuit including a timing changing circuit for adjusting timings; a fifth external input terminal (timing changing signal input pad: PD2G); and an internal timing determining circuit that determines whether the timing changing circuit is activated, in synchronization with an output signal of the control circuit (command decoder circuit), according to an input signal supplied via the fifth external input terminal.

The foregoing configuration makes it possible to readily adjust the internal timing signal as to each of wafers or chips.

In the semiconductor device according to the present invention, the second semiconductor chip includes: an internal voltage generating circuit including a detection level varying circuit for varying an internal generated voltage; a fourth external input terminal (detection level varying signal input pad: PD2F); a detection level determining circuit that determines whether the detection level varying circuit is activated, in synchronization with an output signal of the control circuit (command decoder circuit), according to an input signal supplied via the fourth external input terminal; an internal timing signal generating circuit including a timing changing circuit for adjusting timings; a fifth external input terminal (timing changing signal input pad: (PD2G); an internal timing determining circuit that determines whether the timing changing circuit is activated, in synchronization with an output signal of the control circuit, according to an input signal supplied via the fifth external input terminal; and a first selector circuit. The first selector circuit preferably has a function of selectively supplying a signal supplied via an external address input terminal to the restoration state determining circuit, the detection level determining circuit, and the internal timing determining circuit, according to an output signal of the control circuit.

The foregoing configuration allows for the input of the redundancy restoration solution, the variation of the detection level of the internal generated voltage, or the signal input for changing the internal timing, without increasing the number of external input terminals.

DETAILED DESCRIPTION OF THE INVENTION

Figure 1:
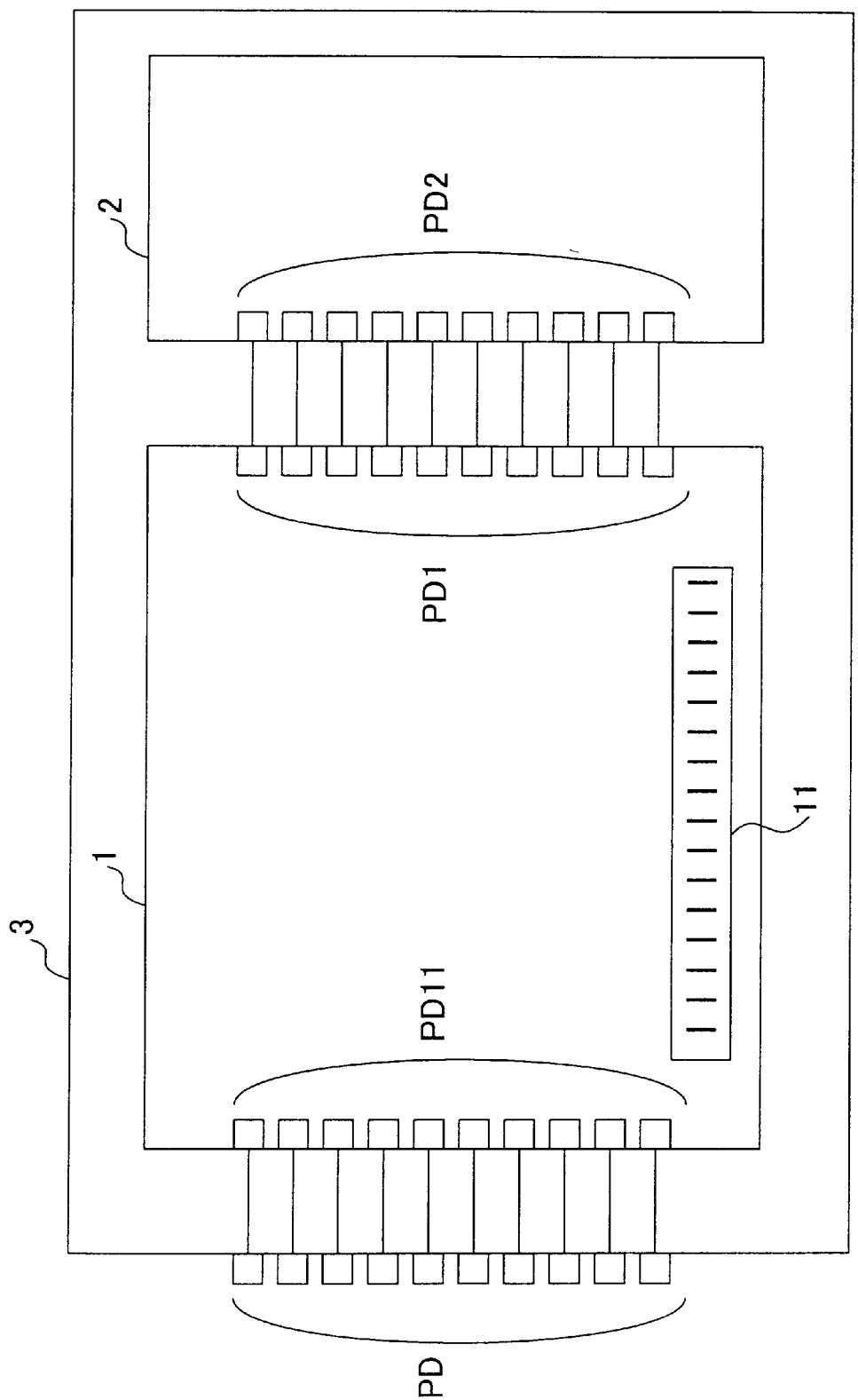
FIG. 1 is a view schematically illustrating an example of a structure of a semiconductor device according to a first embodiment of the present invention.

The following will describe an embodiment of the present invention, while referring to the drawings.

First Embodiment

FIG. 1 is a view schematically illustrating a configuration of a multichip semiconductor device according to the first embodiment of the present invention. In FIG. 1, 1 denotes a first semiconductor chip having a function as a CPU or the like, 2 denotes a second semiconductor chip as a rewritable memory, and 3 denotes an integrated circuit package. The multichip semiconductor device has a COC structure in which the second semiconductor chip 2 as a child chip is interconnected on a surface of the first semiconductor chip 1 as a parent chip. It should be noted that FIG. 1 illustrates the chips in a side-by-side orientation for convenience in illustration. The first semiconductor chip 1 is equipped with a fuse 11 for restoring redundancy, which is for storing a redundancy restoration solution for restoring defective bits in the second semiconductor chip 2. The first semiconductor chip 1 and the second semiconductor chip 2 are connected with each other via internal connection pads PD1 and PD2. External connection terminals PD of the integrated circuit package 3 are connected with external connection pads PD 11 of the first semiconductor chip via bonding wires, so that signals are transmitted between the first semiconductor chip 1 and the outside.

Figure 2:
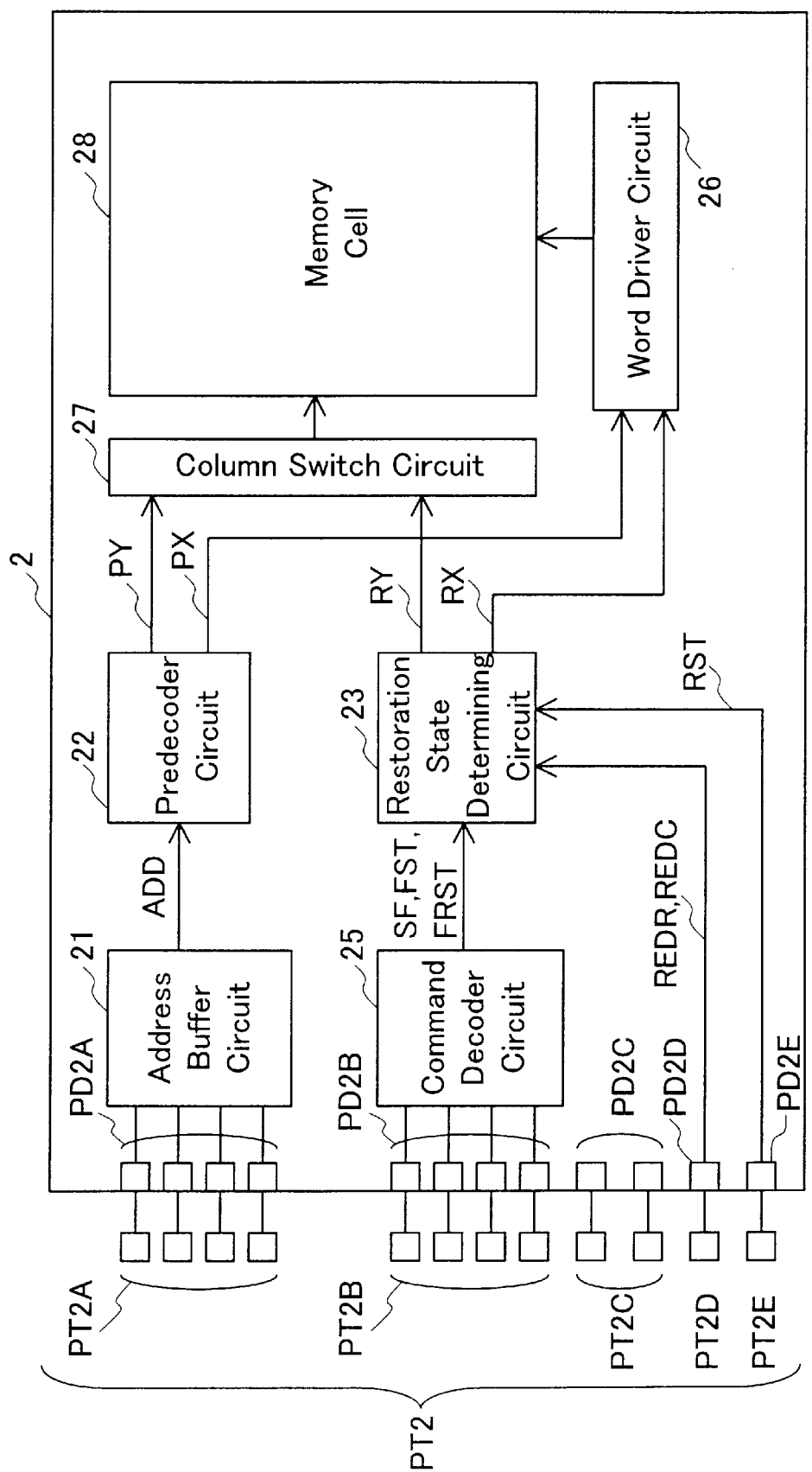
FIG. 2 is a circuit block diagram illustrating an internal configuration of a second semiconductor chip 2 shown in FIG. 1.

FIG. 2 is a circuit block diagram illustrating an internal configuration of the second semiconductor chip 2. In FIG. 2, the internal connection pads PD2 (FIG. 1) are composed of address signal input pads PD2A, command signal input pads PD2B, data input/output pads PD2C, a serial data input pad PD2D for input of the restoration information for redundancy restoration, and an input pad PD2E for input of a signal RST that instructs the execution of redundancy restoration.

Normally, the pads are provided at narrow pitches on the semiconductor device for achieving the COC structure, and it is very difficult to carry out a probe test by employing the foregoing pads. Therefore, in checking a wafer, test pads PT2 are used that are provided on the wafer independently and that have the same potentials as those of the internal connection pads PD2.

21 denotes an address buffer circuit, and 22 denotes an address predecoder circuit. A signal ADD supplied from the address buffer circuit 21 is fed to the address predecoder circuit 22, and the address predecoder circuit 22 outputs a predecode signal PX in a row direction and a predecode signal PY in a column direction.

23 denotes a restoration state determining circuit that stores either a fuse signal fed from the first semiconductor chip 1, or a redundancy restoration solution supplied from the input pad PT2D after the probe test before the redundancy restoration, and outputs signals RX and RY that instruct to replace a specific cell with a redundancy cell according to the input signal RST fed from the pad PT2E. 25 denotes a command decoder circuit. The command decoder circuit 25 makes a transition to a fuse signal input mode according to a combination of command signals that are supplied from the command signal input pad PT2B and that are not used in normal operations, and supplies the restoration state determining circuit 23 with a signal SF indicative of the command decode circuit 25 being in the fuse signal input mode.

26 and 27 denote a word driver circuit and a column switch circuit, respectively, which select specific addresses according to the predecode signals PX and PY, respectively. The word driver circuit 26 and the column switch circuit 27 have functions of changing addresses according to the restoration signals RX and RY, respectively, which are supplied from the restoration state determining circuit 23 in the redundancy restoration, so that a cell for the redundancy restoration is selected according to a defective address. 28 is a memory cell.

The probe test for the second semiconductor chip 2 is carried out by feeding an address signal, a command signal, and data for the test from outside to the test pads PT2, and vice versa. In the case where the redundancy restoration is determined to be necessary with respect to the second semiconductor chip 2 as a result of the P1 test, in order to cause a transition of the second semiconductor chip 2 into a redundancy restoration state, a command signal is supplied to the command signal input pad PT2B so as to cause a transition of the second semiconductor chip 2 into the fuse signal input mode, and a redundancy restoration signal REDR in the row direction and a redundancy restoration signal REDC in the column direction, which are in a serial data form (a logic "L" level is indicative of a state in which a fuse is blown, and a logic "H" level is indicative of a state in which a fuse is not blown), are supplied to the serial data input pad PT2D.

Figure 3:
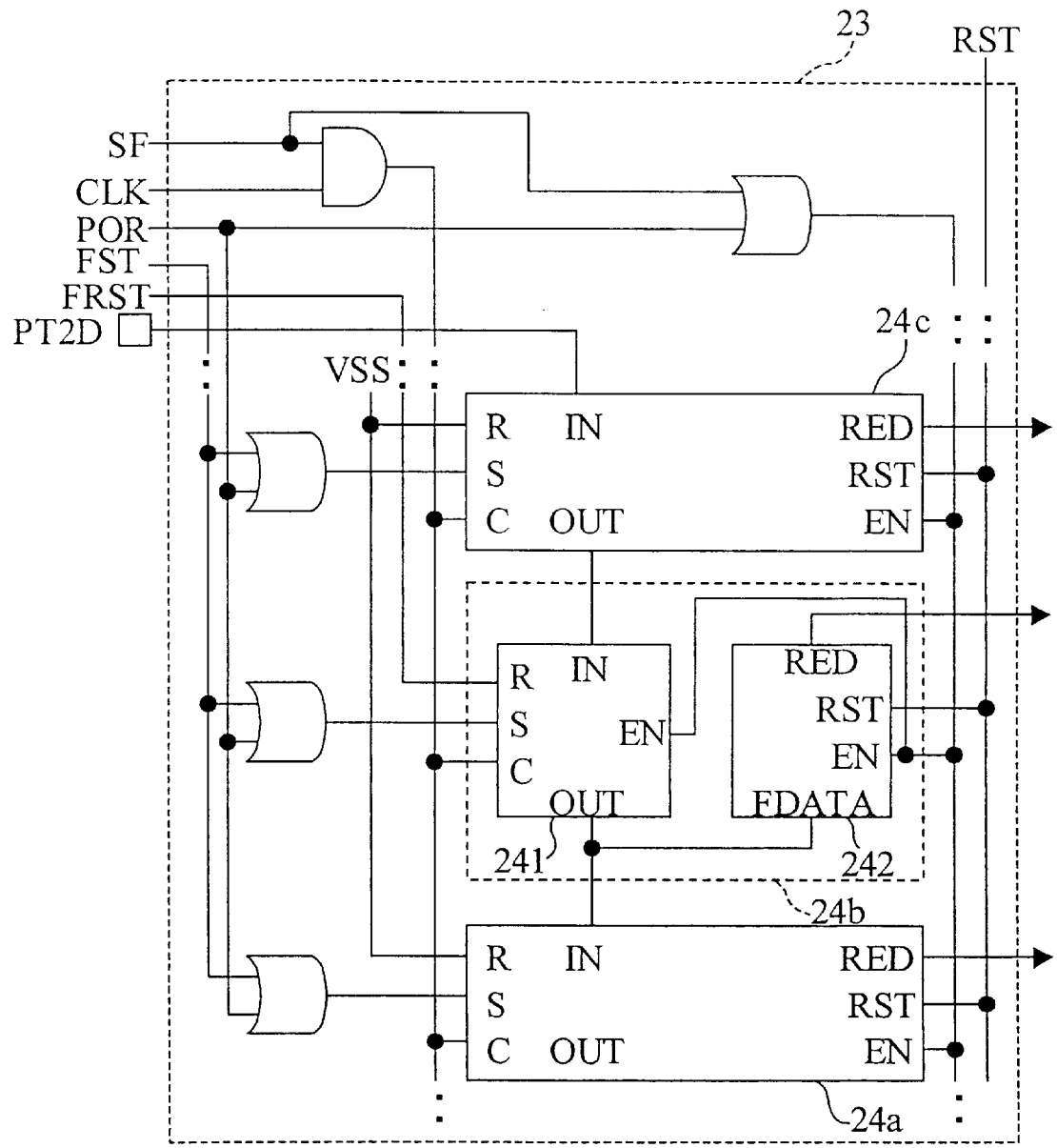
FIG. 3 is a circuit diagram illustrating an internal configuration of a restoration state determining circuit 23 shown in FIG. 2.
Figure 4:
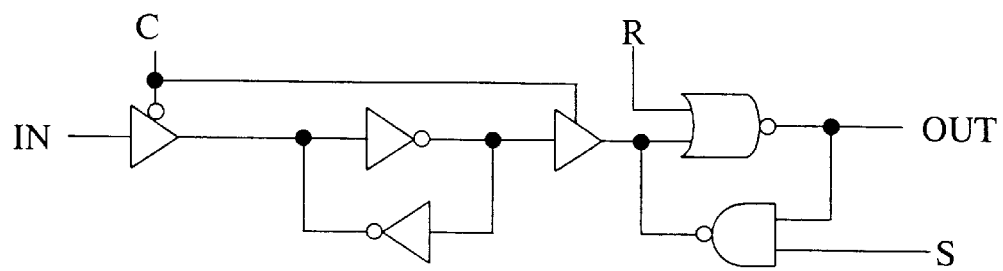
FIG. 4 is a circuit diagram illustrating an internal configuration of a register 241 shown in FIG. 3.
Figure 5:
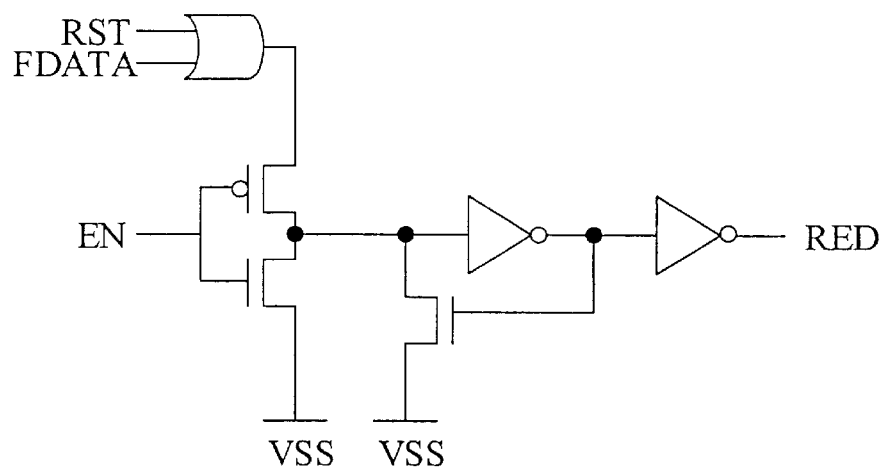
FIG. 5 is a circuit diagram illustrating an internal configuration of a fuse signal latch circuit 242 shown in FIG. 3.

FIG. 3 is a circuit diagram illustrating an internal configuration of the restoration state determining circuit 23 shown in FIG. 2. In FIG. 3, each of fuse signal determining circuits 24a, 24b, and 24c is composed of, for instance, a register 241 like a D-type flip-flop, and an output circuit 242 that latches an output signal of the register 241, outputs the same as the restoration signal RX to the word driver circuit 26, and outputs the same as the restoration signal RY to the column switch circuit 27. FIG. 4 is a circuit diagram illustrating an internal configuration of a register 241, and FIG. 5 is a circuit diagram illustrating an internal configuration of the output circuit 242.

The register 241 has a S (set) terminal as an input terminal that causes a value stored in the register to make a transition to a logic "H" level, and has a R (reset) terminal as an input that causes the value to make a transition to a logic "L" level. Since a signal POR is supplied to the S terminal, the value stored inside necessarily is set to be the logic "H" level when power is applied. Besides, a signal FRST is supplied to only a part of the fuse signal determining circuits, for instance, to only the R terminal of the fuse signal determining circuit 24b in FIG. 3, whereas a ground potential VSS is supplied to the R terminals of the other fuse signal determining circuits 24a and 24c.

Furthermore, the fuse signal determining circuits 24a, 24b, and 24c are connected in series so that an output signal OUT of a register 241 at a certain stage is fed as an input signal IN to a register 241 at a next stage. When the second semiconductor chip 2 enters a fuse signal input mode, the register 241 of the fuse signal determining circuit at the certain stage operates in synchronization with a signal CLK, and shifts data to the register 241 of the fuse signal determining circuit at the next stage.

The following will describe an operation after the P1 test of the second semiconductor chip 2.

After the redundancy restoration signal REDR in the row direction and the redundancy restoration signal REDC in the column direction are supplied as serial data to the serial data input pad PT2D, the restoration signal input mode is cleared. When the signal RST with the logic "L" level is supplied from the pad PT2E, the restoration information stored in the register 241 (FIG. 3) is fed as the restoration information RX in the row direction and the restoration information RY in the column direction to the word driver circuit 26 and the column switch circuit 27, respectively. Therefore, it is possible to achieve the redundancy restoration state by the control of the external signal without blowing the fuse 11.

Thereafter, by supplying test addresses, command signals, and data from outside to the test pads PT2 and vice versa, it is possible to execute the test in the redundancy restoration state.

Furthermore, a part of the registers 241 (in FIG. 3, the register 241 of the fuse signal determining circuit 24b) receives a signal FRST that is generated by the command decoder circuit 25 according to a combination of command signals supplied from the command input pad PT2B and not used in a normal operation and that is. In response to the signal FRST, the value held therein is reset, and a fuse blown state is exhibited. Therefore, by arranging a part of the registers 241 appropriately, it is possible to produce a state in which only some of the registers 241 store only a redundancy restoration solution according to the signal FRST. Furthermore, since the values held inside the registers 241 are set by the command decoder circuit 25 according to the signal FST that is generated according to a combination of command signals fed via the command input pad PT2E and not used in a normal operation, it is possible to test a plurality of cells as redundancy restoration targets immediately.

This results in a simulated redundancy restoration state in the P1 test, thereby making it possible to test cells as the redundancy restoration targets under the same conditions as those in the actual redundancy restoration state. Furthermore, if necessary, a pre-redundancy-restoration state can be achieved by causing the signal RST to make a transition to the logic "H" level, whereby problems caused by the redundancy restoration can be checked readily.

Figure 6:
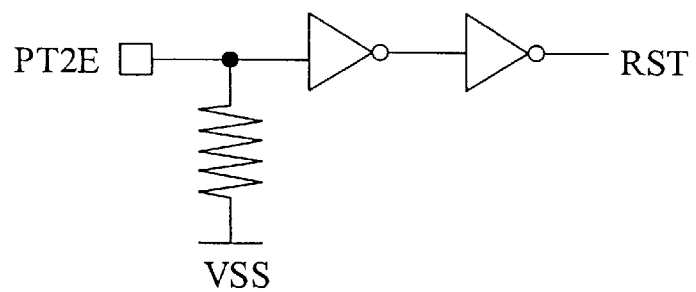
FIG. 6 is a circuit diagram illustrating a configuration of an input circuit for supplying a signal RST from an external input pad PT2E.

Thus, according to the present embodiment, it is possible to carry out a test without blowing the fuse 11 actually, by producing a post-redundancy-restoration state. This results in the reduction of cost for tests. It should be noted that in the case where after the interconnection the second semiconductor chip 2 does not need the pads PD2E to which the signal RST is supplied, the configuration may be such that the pad PT2E is provided on only the wafer and the pad PD2E is not provided on the second semiconductor chip 2. In this case, to produce a redundancy restoration state upon interconnection, a configuration as shown in FIG. 6 is used preferably.

Furthermore, with a configuration in which the restoration state determining circuit 23 is composed of the shift registers 241, it is possible to supply the redundancy restoration solution via only one external input pad so that it is stored in the shift registers 241.

Furthermore, it is possible to produce readily a pre-redundancy-restoration state and a post-redundancy-restoration state according to a control signal RST from the outside. For instance, in the case where spare cells provided for the redundancy restoration are located far from addresses of defective cells as restoration targets, the foregoing configuration makes it possible to find out readily defects in the redundancy restoration, which are caused by timing defects due to delays or circuit defects.

It should be noted that the redundancy restoration solution is supplied as serial data in the present embodiment, but signals decoded by an internal decoder circuit may be stored in the fuse signal determining circuits 24a, 24b, and 24c.

Second Embodiment

Figure 7:
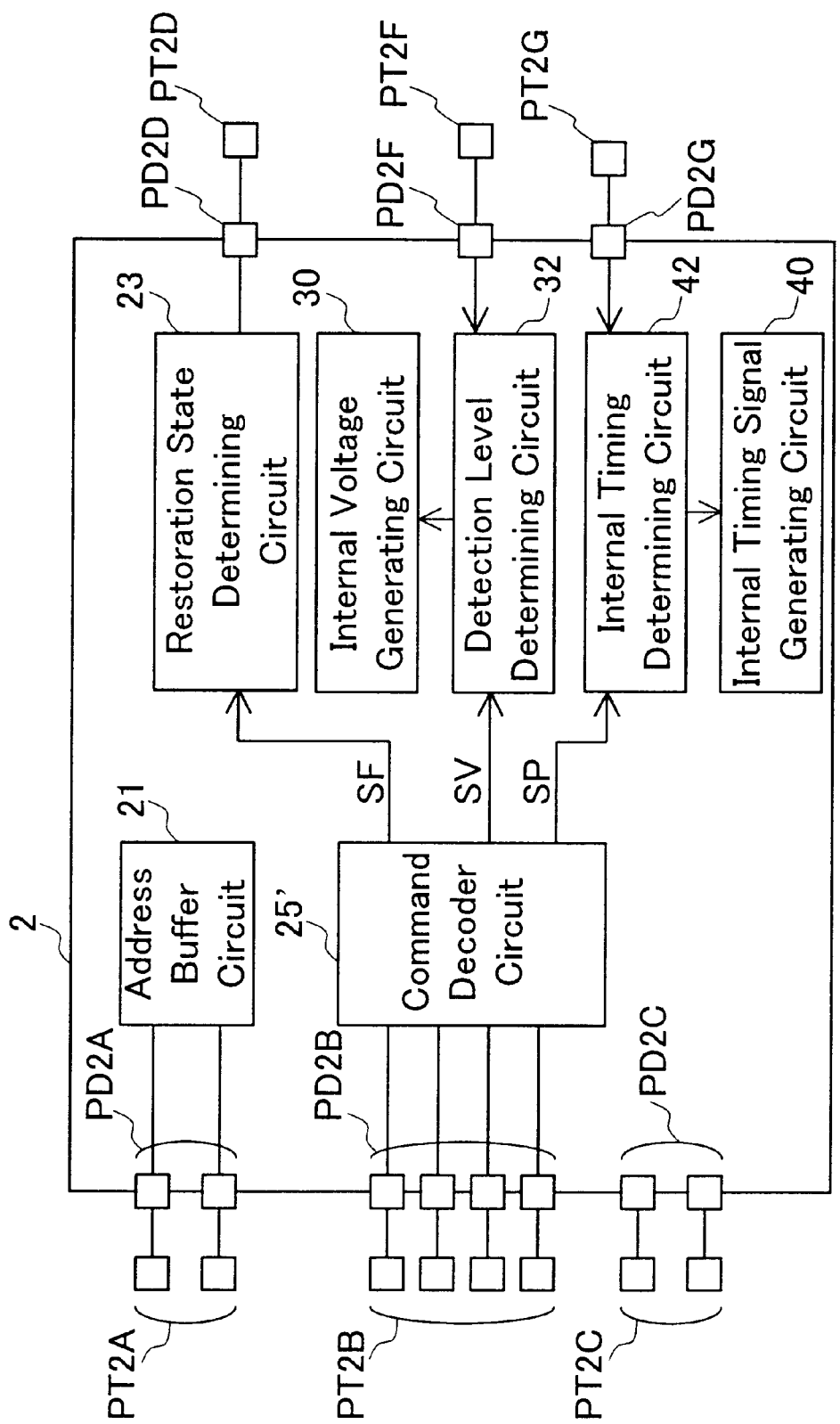
FIG. 7 is a circuit block diagram illustrating an internal configuration of a second semiconductor chip 2 in the semiconductor device according to a second embodiment of the present invention.

FIG. 7 is a circuit block diagram illustrating a configuration example of a second semiconductor chip 2 in a semiconductor device according to the second embodiment of the present invention. In the present embodiment as well as in the first embodiment, the semiconductor device has a COC structure in which the first semiconductor chip 1 and the second semiconductor chip 2 are interconnected with each other inside the integrated circuit package 3. It should be noted that in FIG. 7, the same constituent members as those shown in FIG. 2 are designated by the same reference numerals, and descriptions of the same are omitted. Further, in FIG. 7, for convenience in description, the word driver circuit 26, the column switch circuit 27, and the memory cell 28 in FIG. 2 are not shown.

In FIG. 7, 30 denotes an internal voltage generating circuit, and 32 denotes a detection level determining circuit that determines a potential generated by the internal voltage generating circuit 30. 40 denotes an internal timing signal generating circuit, and 42 denotes an internal timing determining circuit that changes a timing or a pulse width of a signal generated by the internal timing signal generating circuit 40.

A command decoder circuit 25' makes a transition into a detection level varying mode according to a combination of command signals supplied from outside and not used in a normal operation, and sends a detection level switching signal SV to the detection level determining circuit 32. Furthermore, the command decoder circuit 25' makes a transition into an internal timing changing mode in response to a combination of command signals supplied thereto, that are different from those described above and not used in a normal operation, and sends a timing switching signal SP to the timing determining circuit 42.

Figure 8:
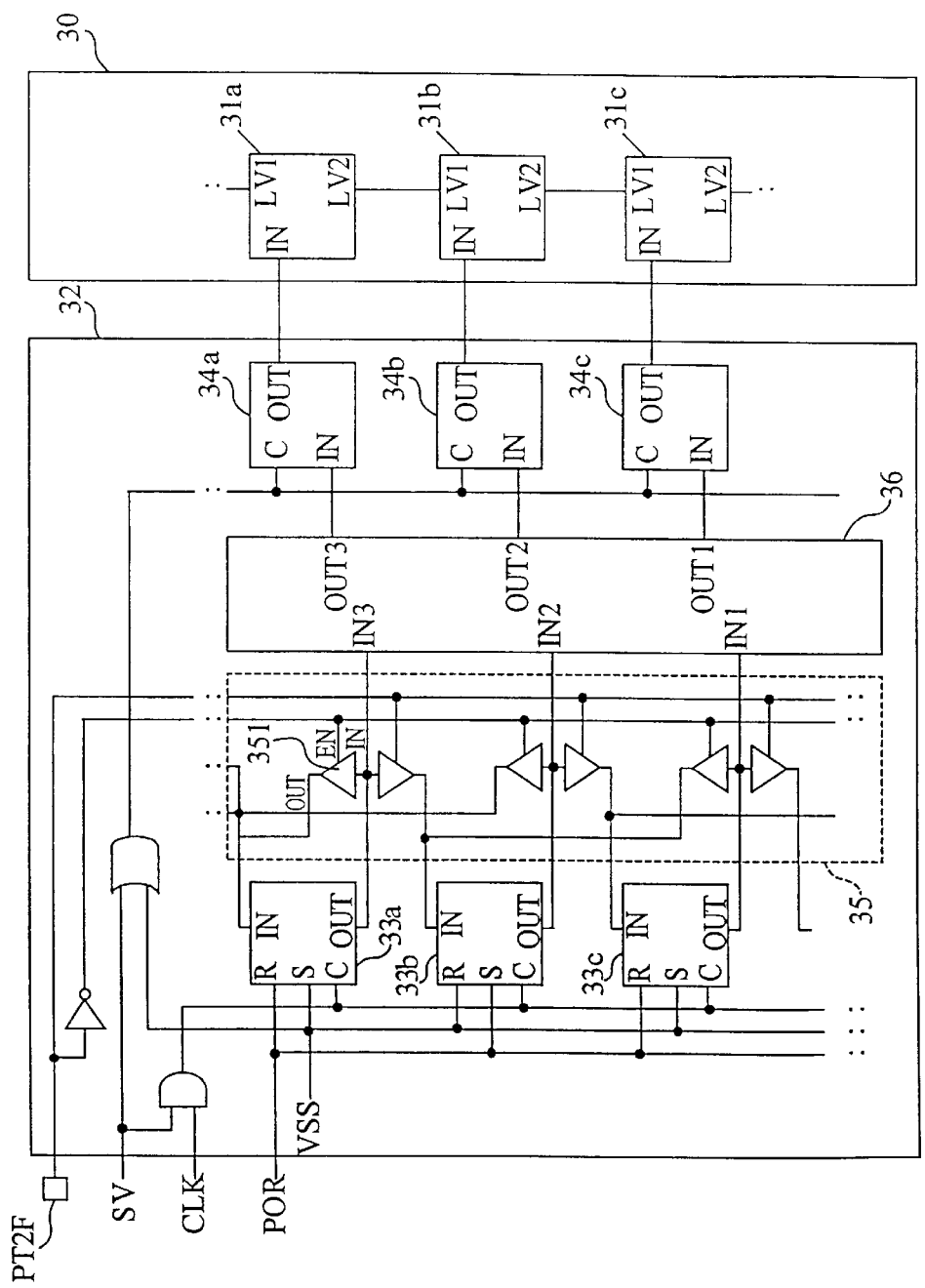
FIG. 8 is a circuit block diagram illustrating an internal configuration of an internal voltage generating circuit 30 and a detection level determining circuit 32 shown in FIG. 7
Figure 9:
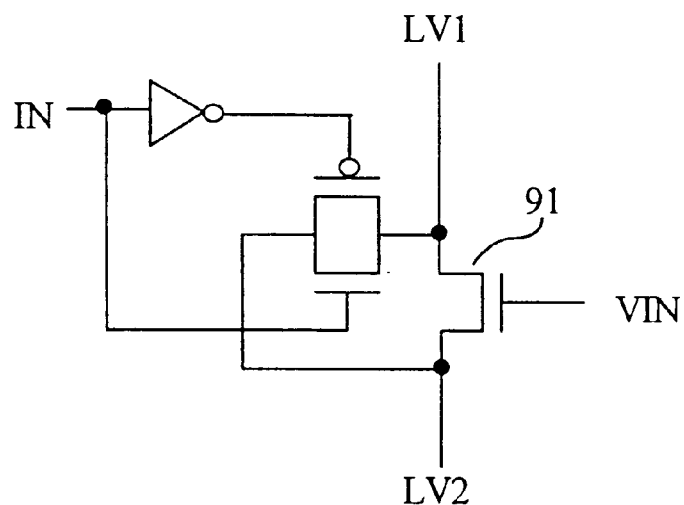
FIG. 9 is a circuit diagram illustrating an internal configuration of each of detection level varying circuits 31a, 31b, and 31c composing the detection level determining circuit 32 shown in FIG. 8.

FIG. 8 is a circuit block diagram illustrating an internal configuration of the internal voltage generating circuit 30 and the detection level determining circuit 32 shown in FIG. 7. In FIG. 8, the internal voltage generating circuit 30 includes a plurality of detection level varying circuits 31a, 31b, and 31c for varying a detection level. Each of the detection level varying circuits 31a, 31b, and 31c has an internal configuration as shown in FIG. 9, and in response to an input signal IN, makes valid or invalid a change of a voltage level by a transistor 91 having a drain to which a voltage level LV1 is applied and a source to which a voltage level LV2 is applied. Here, VIN in FIG. 9 is an internal signal in the internal voltage generating circuit 30, a power source potential VDD, or the ground potential VSS for varying a voltage level, and the transistors 91 in the detection level varying circuits have different gate lengths. According to the combination of the transistors 91, it is possible to vary the generated voltage level.

Figure 10:
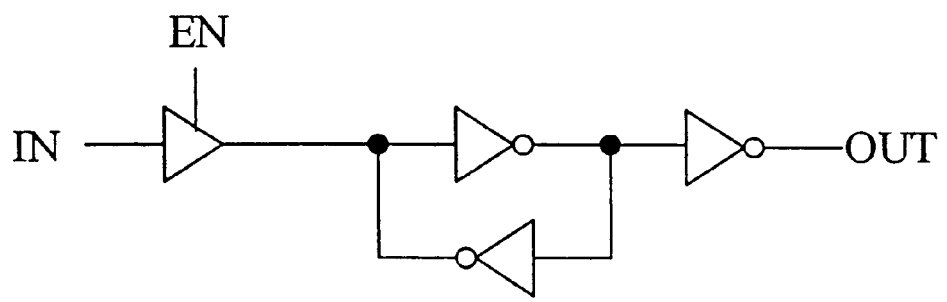
FIG. 10 is a circuit diagram illustrating an internal configuration of each of switching circuits 351 composing a route changing circuit 35 shown in FIG. 8.

Furthermore, the detection level determining circuit 32 includes register circuits 33a, 33b, and 33c, latch circuits 34a, 34b, and 34c, a route changing circuit 35 that changes routes through which input signals are supplied to the register circuits 33a, 33b, and 33c and output signals are fed therefrom, and a encoder circuit 36. Each of the register circuits 33a, 33b, and 33c has an internal configuration shown in FIG. 4, which is described above. A signal POR is fed to only an input terminal S of the register circuit 33b among the register circuits 33a, 33b, and 33c. Furthermore, FIG. 10 is a circuit diagram illustrating an internal configuration of switching circuits 351 composing the route changing circuit 35.

Output signals (OUT) from the register circuit 33a, 33b, and 33c are fed to the encoder circuit 36 (IN3, IN2, and IN1, respectively), and encode signals (OUT3, OUT2, and OUT1, respectively) as output signals from the encoder circuit 36 are latched by the latch circuits 34a, 34b, and 34c, respectively, whereby only one detection level is set after power is applied.

The detection level determining circuit 32 causes only the register circuit 33b to hold the logic "H" level after the application of power, while causing the other registers 33a and 33c to hold the logic "L" level. In response to a command supplied from outside, a transition is made into a detection level varying mode, and when the SV signal is at the logic "H" level, in synchronization with the signal CLK, data stored in the register circuits 33a, 33b, and 33c are shifted so that the detection level is raised in the case where an input signal to an external input pad PT2F is at the logic "H" level, or so that the detection level is lowered in the case where the input signal to the external input pad PT2F is at the logic "L" level. Then, the data are fed to the encoder circuit 36. When a transition is made out of the detection level varying mode, the latch circuits 34a, 34b, and 34c latch output signals from the encoder circuit 36, and supply the latched signals to the detection level varying circuits 31a, 31b, and 31c, respectively, to vary the detection level. By so doing, the internal voltage generated therein is varied.

Figure 11:
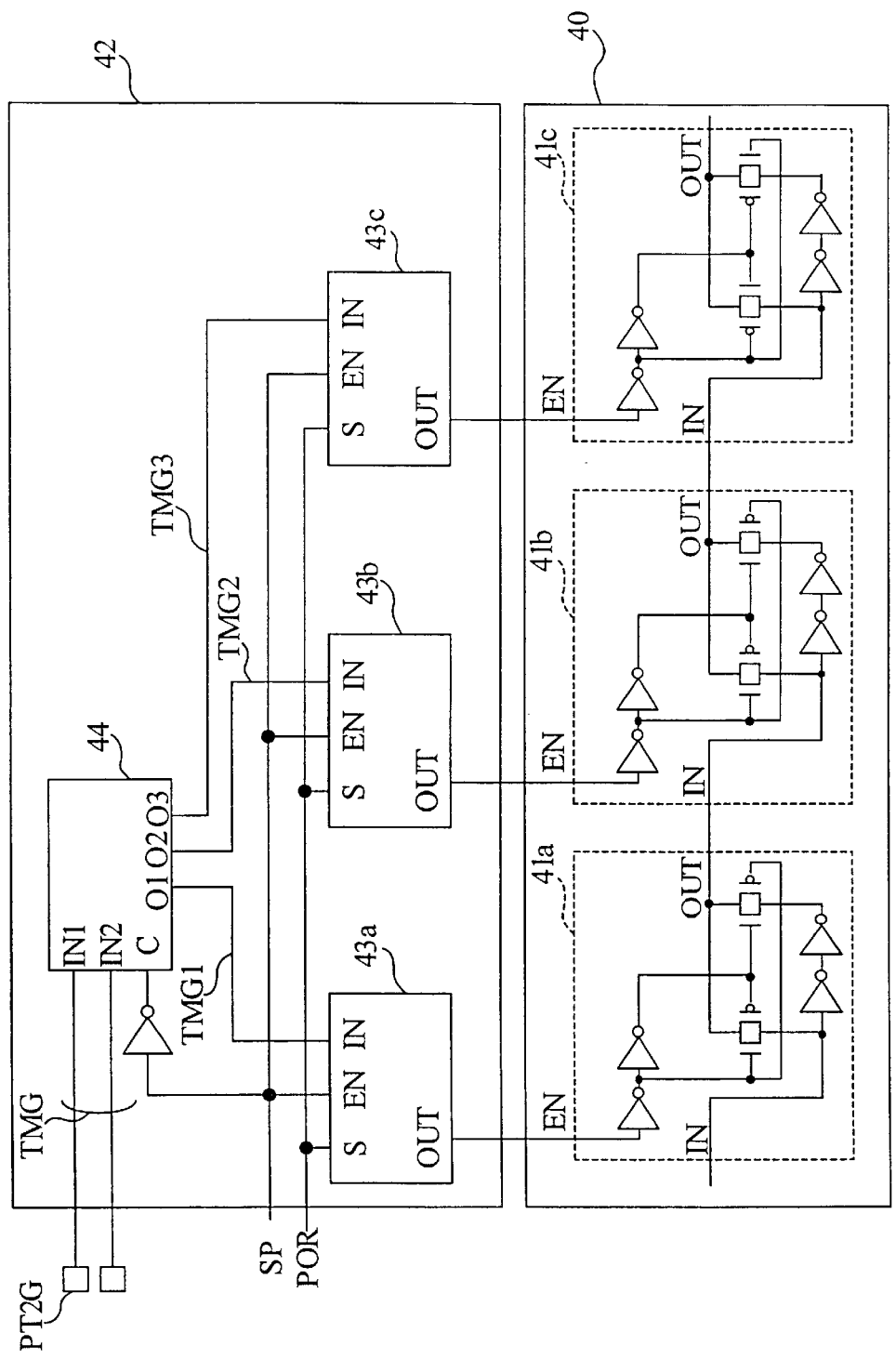
FIG. 11 is a circuit block diagram illustrating an internal configuration of an internal timing signal generating circuit 40 and a timing determining circuit 42 shown in FIG. 7.

FIG. 11 is a circuit block diagram illustrating an internal configuration of the internal timing signal generating circuit 40 and the timing determining circuit 42 in FIG. 7. In FIG. 11, the internal timing signal generating circuit 40 includes a plurality of timing changing circuits for adjusting timings, and several among the same, that is, timing changing circuits 41a, 41b, and 41c receive output signals (OUT) as signals EN from latch circuits 43a, 43b, and 43c, respectively, and it is determined whether the timing changing circuits 41a, 41b, and 41c are activated or not according to the signals EN, respectively.

Figure 12:
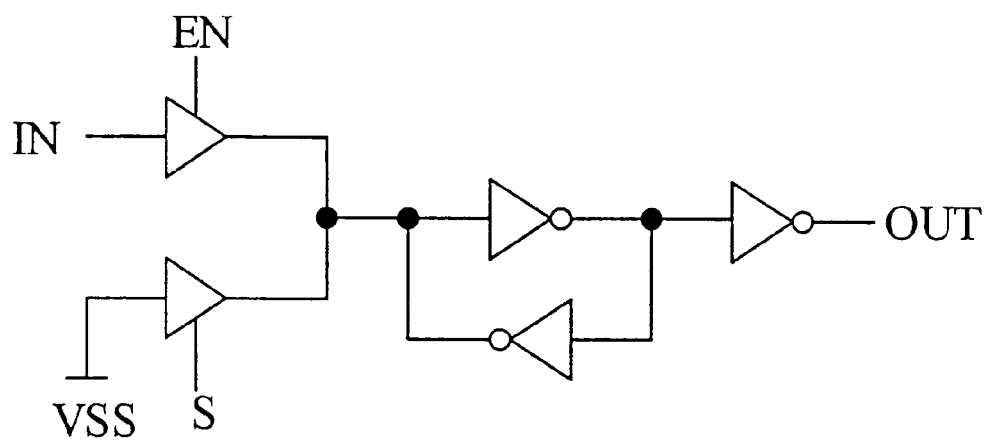
FIG. 12 is a circuit diagram illustrating an internal configuration of each of latch circuits 43a, 43b, and 43c in the timing determining circuit 42 shown in FIG. 11.

When a transition is made into the internal timing changing mode in response to a command supplied from outside, a decoder circuit 44 decodes the timing changing signal TMG received through the external input pad PT2G, and decode signals TMG1, TMG2, and TMG3 obtained are supplied to the latch circuits 43a, 43b, and 43c. FIG. 12 is a circuit diagram illustrating the internal configuration of each of the latch circuits 43a, 43b, and 43c. After latching the ground potential VSS when power is turned on, the latch circuits 43a, 43b, and 43c receive decode signals TMG1, TMG2, and TMG3, respectively, while a signal SP that is output in the timing changing mode is at the logic "H" level, and send the latched signals to the timing changing circuits 41a, 41b, and 41c.

The timing changing circuits 41a, 41b, and 41c change timings by means of CMOS switches according to the signals supplied from the latch circuits 43a, 43b, and 43c, respectively. This enables the internal timing signal generating circuit 40 to generate signals with changed timings in a subsequent normal operation.

Thus, according to the present embodiment, it is possible to vary a detection level of the internal voltage generating circuit 30 from the outside. Furthermore, it is possible to produce a state identical to that after the timing is changed actually, by the control with a signal supplied from outside. This makes it possible to carry out an optimal timing adjustment for each wafer or each chip.

It should be noted that in the present embodiment, the routes of the input signals and output signals to/from the register circuits 33a, 33b, and 33c inside the detection level determining circuit 32 are changed by the route changing circuit 35 according to an input signal via the external input pad PT2F, but this route changing mechanism may be achieved with a configuration including ordinary shift registers in which serial data supplied from the outside are stored.

Furthermore, the internal timing determining circuit 42 decodes the signal TMG supplied from the outside, and stores the obtained decode signals TMG1, TMG2, and TMG3 in the latch circuits 43a, 43b, and 43c, respectively, but as in the first embodiment, the signal TMG may be serial data, and the timing changing data TMG may be stored in a shift register composed of register circuits connected in series, in synchronization with the signal CLK during the timing changing mode.

Third Embodiment

Figure 13:
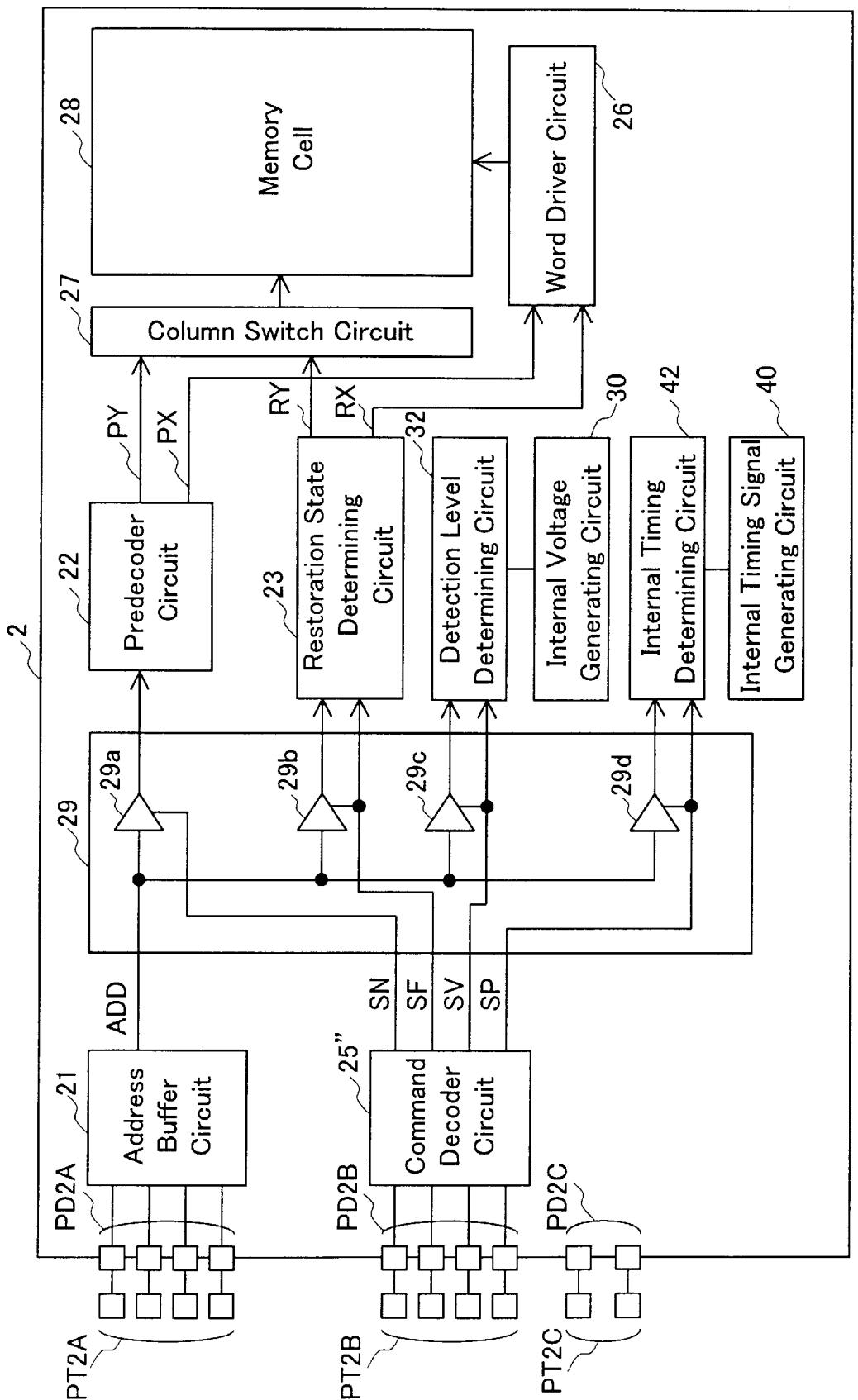
FIG. 13 is a circuit block diagram illustrating an internal configuration of a second semiconductor chip 2 in a semiconductor device according to a third embodiment of the present invention.
Figure 14:
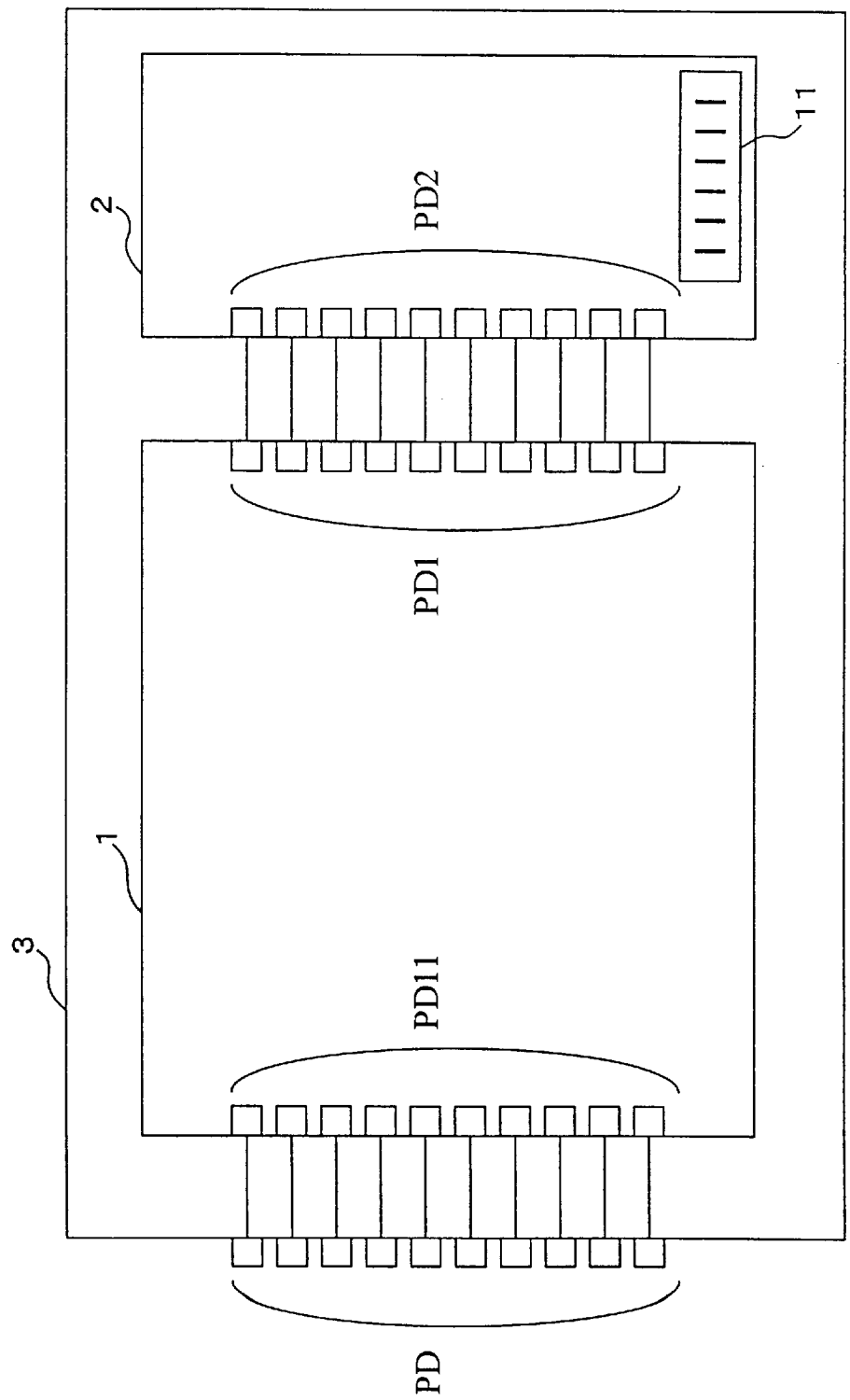
FIG. 14 is a schematic view illustrating a configuration example of a conventional multichip semiconductor device.

FIG. 13 is a circuit block diagram illustrating a configuration example of a second semiconductor chip 2 in a semiconductor device according to the third embodiment of the present invention. In the present embodiment as well as in the aforementioned embodiments, the semiconductor device has a COC structure in which the first semiconductor chip 1 and the second semiconductor chip 2 are interconnected with each other inside the integrated circuit package 3. It should be noted that in FIG. 13, the same constituent members as those shown in FIGS. 2 and 7 are designated by the same reference numerals, and descriptions of the same are omitted.

A command decoder circuit 25" makes a transition into a fuse signal input mode, a detection level varying mode, or a timing changing mode in response to a combination of external command signals that are not used in a normal operation, respectively, and feeds switching signals SF, SV, and SP according to the mode. The command decode circuit 25" outputs a signal SN in a normal operation other than the operations in the foregoing modes.

A selector circuit 29 sends an output signal ADD supplied from the address buffer circuit 21 to any one of the predecoder circuit 22, the restoration state determining circuit 23, the detection level determining circuit 32, and the internal timing determining circuit 42 through one of switching circuits 29a, 29b, 29c, and 29d provided in the selector circuit 29, according to the output signals SN, SF, SV, and SP of the command decoder circuit 25".

In each of the input modes, the fuse signal for the redundancy restoration, the detection level varying signal, and the timing changing signal are supplied, each in a serial data form, via address input pads PT2A, and are sent to respective register circuits in synchronization with the signal CLK in each mode. The use of this input method makes it possible to produce a post-redundancy-restoration state, to vary the detection level of the internal voltage, and to change the internal timing, without increasing the number of input pads.

It should be noted that the above embodiments of the present invention are described referring to a semiconductor device having a COC structure, but the same effect can be achieved with a semiconductor device having a multichip structure in which pads are connected by wire bonding.

Furthermore, each of the restoration state determining circuit 23, the detection level determining circuit 32, and the internal timing determining circuit 42 may be composed of a shift register, and the data setting with respect to each may be carried out by supplying serial data when it is in each internal mode.

As described above, the present invention makes it possible to achieve specific effects as follows: it is possible to produce a post-redundancy-restoration state even in the case where the second semiconductor chip as a rewritable memory in a multichip semiconductor device does not has a fuse, and it is possible to implement the variation of the internal voltage detecting level and the changing of the internal timing as to each chip without increasing the number of external input terminals.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A multichip semiconductor device comprising a first semiconductor chip and a second semiconductor chip as a rewritable memory that are connected with each other inside a package, wherein
   the first semiconductor chip has a fuse for redundancy restoration, the fuse being for storing a redundancy restoration solution for restoring defective bits in the second semiconductor chip, and
   the second semiconductor chip includes redundancy cells to be replaced for the defective bits, and comprises means for producing a post-redundancy-restoration state in which the defective bits are replaced with the redundancy cells, before being connected with the first semiconductor chip.

2. The multichip semiconductor device according to claim 1, wherein the second semiconductor chip includes:
   a first external input terminal; and
   a restoration state determining circuit for storing a redundancy restoration solution for restoring the defective bits supplied thereto via the first external input terminal.

3. A multichip semiconductor device comprising a first semiconductor chip and a second semiconductor chip as a rewritable memory that are connected with each other inside a package, wherein
   the first semiconductor chip has a fuse for redundancy restoration, the fuse being for storing a redundancy restoration solution for restoring defective bits in the second semiconductor chip, and
   the second semiconductor chip includes:
   a plurality of memory cells;
   a redundancy memory cell to be replaced for a defective bit of the plurality of memory cells;
   a first external input terminal; and
   a restoration state determining circuit for storing a redundancy restoration solution for restoring the defective bit to be replaced with the redundancy memory cell, the redundancy restoration solution being supplied via the first external input terminal.

4. The multichip semiconductor device according to claim 3, wherein the second semiconductor chip includes:
   a second external input terminal; and
   a control circuit that controls input to the restoration state determining circuit via the first external input terminal according to a signal supplied via the second external input terminal.

5. The multichip semiconductor device according to claim 4, wherein
   the second semiconductor chip includes a third external input terminal and a memory cell selecting circuit, and
   the restoration state determining circuit includes an output circuit that sends the stored redundancy restoration solution to the memory cell selecting circuit according to an input signal supplied via the third external input terminal.

6. The multichip semiconductor device according to claim 4, wherein the restoration state determining circuit includes a first shift register, and stores serial data supplied via the first external input terminal in synchronization with an output signal of the control circuit.

7. The multichip semiconductor device according to claim 4, wherein the restoration stage determining circuit includes a plurality of register circuits, and varies a value held by the plurality of register circuits according to an output signal of the control circuit, in response to an input signal supplied via the second external input terminal.

8. The multichip semiconductor device according to claim 4, wherein the second semiconductor chip includes:
   an internal voltage generating circuit including a detection level varying circuit for varying an internal generated voltage:
   a fourth external input terminal; and
   a detection level determining circuit that determines whether the detection level varying circuit is activated, in synchronization with an output signal of the control circuit, according to an input signal supplied via the fourth external input terminal.

9. The multichip semiconductor device according to claim 8, wherein the detection level determining circuit includes:
   second register circuits corresponding to respective generated voltages that can be generated when the internal voltage generating circuit utilizes the detection level varying circuit; and
   a route changing circuit that changes routes of input signals and output signals to/from the second register circuits according to an input signal supplied via the fourth external input terminal.

10. The multichip semiconductor device according to claim 4, wherein the second semiconductor chip includes:
    an internal timing signal generating circuit including a timing changing circuit for adjusting timings;
    a fifth external input terminal; and
    an internal timing determining circuit that determines whether the timing changing circuit is activated, in synchronization with an output signal of the control circuit, according to an input signal supplied via the fifth external input terminal.

11. The multichip semiconductor device according to claim 4, wherein the second semiconductor chip includes:
    an internal voltage generating circuit including a detection level varying circuit for varying an internal generated voltage;

a fourth external input terminal;

a detection level determining circuit that determines whether the detection level varying circuit is activated, in synchronization with an output signal of the control circuit, according to an input signal supplied via the fourth external input terminal;

an internal timing signal generating circuit including a timing changing circuit for adjusting timings;

a fifth external input terminal;

an internal timing determining circuit that determines whether the timing changing circuit is activated, in synchronization with an output signal of the control circuit, according to an input signal supplied via the fifth external input terminal; and a first selector circuit, wherein the first selector circuit selectively supplies a signal supplied via an external address input terminal to the restoration state determining circuit, the detection level determining circuit, and the internal timing determining circuit, according to an output signal of the control circuit.

* * * * *

UNITED STATES PATENT AND TRADEMARK OFFICE
CERTIFICATE OF CORRECTION

PATENT NO. : 6,696,714 B2
DATED : February 24, 2004
INVENTOR(S) : Hayashi et al.

It is certified that error appears in the above-identified patent and that said Letters Patent is hereby corrected as shown below:

<u>Title page, Item [54], and Column 1, line 2,</u>
"MULTICHIP SEMICONDUCTOR DEVICE HAVING A HIP" should read
-- MULTICHIP SEMICONDUCTOR DEVICE HAVING A CHIP --

Signed and Sealed this

Thirteenth Day of July, 2004

JON W. DUDAS
*Acting Director of the United States Patent and Trademark Office*